(12) United States Patent
Lee

(10) Patent No.: US 11,963,355 B2
(45) Date of Patent: Apr. 16, 2024

(54) SEMICONDUCTOR MEMORY DEVICE AND MANUFACTURING METHOD THEREOF

(71) Applicant: SK hynix Inc., Icheon-si Gyeonggi-do (KR)

(72) Inventor: Dong Hwan Lee, Icheon-si Gyeonggi-do (KR)

(73) Assignee: SK hynix Inc., Ichcon-si Gyeonggi-do (KR)

( * ) Notice: Subject to any disclaimer, the term of this patent is extended or adjusted under 35 U.S.C. 154(b) by 180 days.

(21) Appl. No.: 17/543,525

(22) Filed: Dec. 6, 2021

(65) Prior Publication Data

US 2023/0008539 A1 Jan. 12, 2023

(30) Foreign Application Priority Data

Jul. 6, 2021 (KR) .......................... 10-2021-0088742

(51) Int. Cl.
*H01L 25/065* (2023.01)
*H01L 23/00* (2006.01)
*H01L 25/00* (2006.01)
*H01L 25/18* (2023.01)
(Continued)

(52) U.S. Cl.
CPC ............ *H10B 43/27* (2023.02); *H01L 24/08* (2013.01); *H01L 24/80* (2013.01); *H01L 25/0657* (2013.01); *H01L 25/18* (2013.01); *H01L 25/50* (2013.01); *H10B 41/27* (2023.02); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ........ H10B 43/27; H10B 41/27; H10B 43/40; H10B 41/30; H10B 41/40; H10B 43/30; H01L 24/08; H01L 24/80; H01L 25/0657; H01L 25/18; H01L 25/50; H01L 2224/08145; H01L 2224/80895; H01L 2224/80896; H01L 2924/1431; H01L 2924/14511

See application file for complete search history.

(56) References Cited

U.S. PATENT DOCUMENTS

| | | |
|---|---|---|
| 2015/0270220 A1 | 9/2015 | Moon et al. |
| 2021/0036002 A1* | 2/2021 | Lee .......................... H10B 41/41 |
| 2022/0336488 A1* | 10/2022 | Lee .......................... H10B 43/10 |

FOREIGN PATENT DOCUMENTS

| | | |
|---|---|---|
| KR | 1020200078752 A | 7/2020 |
| KR | 1020200081003 A | 7/2020 |

* cited by examiner

*Primary Examiner* — Thanh Y. Tran
(74) *Attorney, Agent, or Firm* — William Park & Associates Ltd.

(57) ABSTRACT

There are provided a semiconductor memory device and a manufacturing method thereof. The semiconductor memory device includes: a gate stack structure including interlayer insulating layers and conductive patterns, which are alternately stacked in a vertical direction on a substrate; a plurality of channel structures penetrating the gate stack structure, each of the plurality of channel structures with one end portion protruding past a boundary of the gate stack structure; and a source layer formed on the gate stack structure. The protruding end portion of each of the plurality of channel structures extends into the source layer. The protruding end portion of each of the plurality of channel structures has a flat section.

11 Claims, 17 Drawing Sheets

(51) Int. Cl.
*H10B 41/27* (2023.01)
*H10B 43/27* (2023.01)

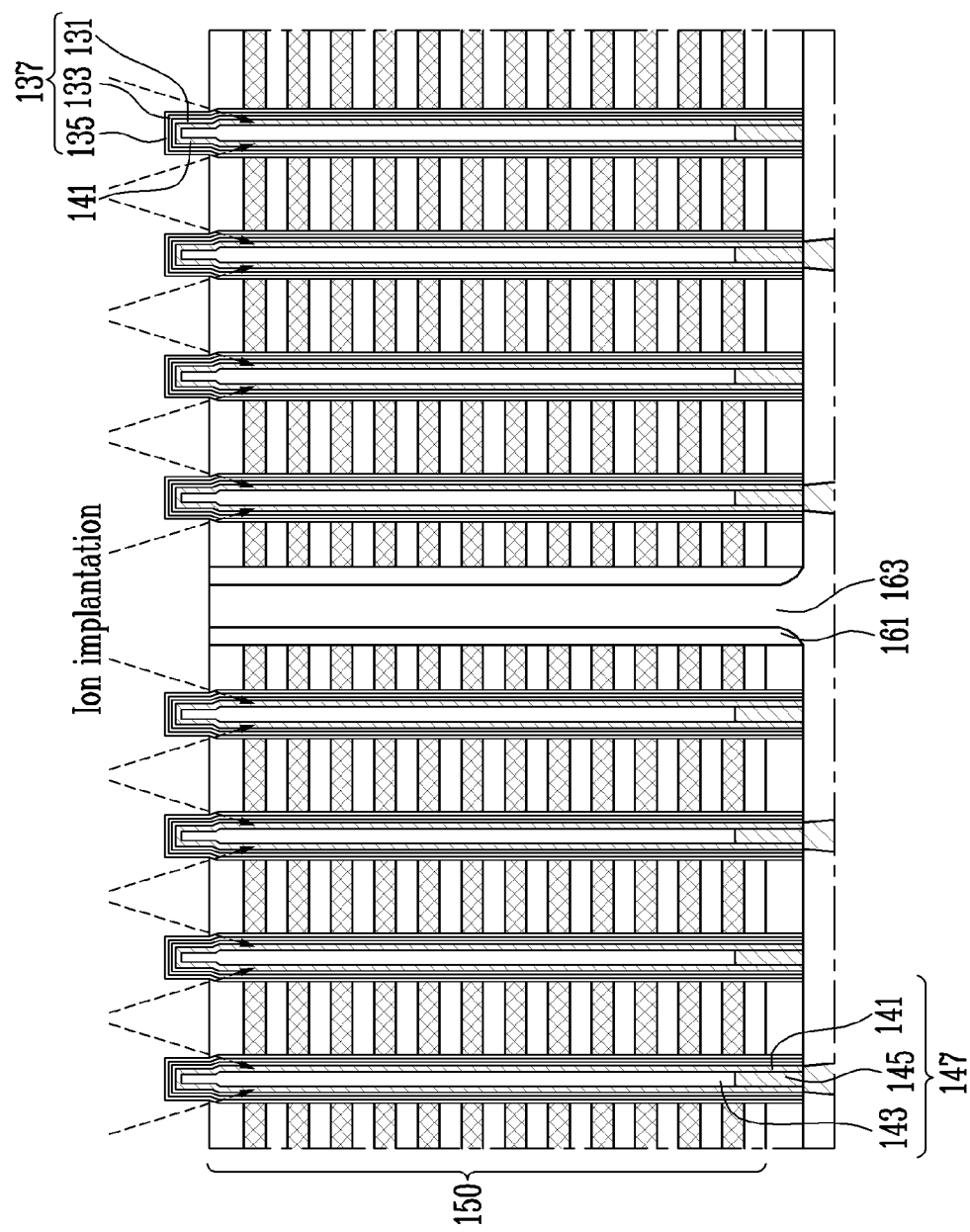

SEMICONDUCTOR MEMORY DEVICE AND MANUFACTURING METHOD THEREOF

CROSS-REFERENCE TO RELATED APPLICATION

The present application claims priority under 35 U.S.C. § 119(a) to Korean patent application number 10-2021-0088742, filed on Jul. 6, 2021, in the Korean Intellectual Property Office, the entire disclosure of which is incorporated herein by reference.

BACKGROUND

1. Technical Field

The present disclosure generally relates to an electronic device, and more particularly, to a semiconductor memory device with a vertical channel structure and a manufacturing method thereof.

2. Related Art

The paradigm on recent computer environment has been turned into ubiquitous computing environment in which computing systems can be used anywhere and anytime. This promotes increasing usage of portable electronic devices such as mobile phones, digital cameras, notebook computers, and the like. Such portable electronic devices may generally include a memory system using a semiconductor memory device, i.e., a data storage device. The data storage device is used as a main memory device or an auxiliary memory device of the portable electronic devices.

A data storage device that uses a semiconductor memory device has excellent stability and durability, high information access speed, and low power consumption, since there is no mechanical driving part. In an example of memory systems with such advantages, the data storage device includes a Universal Serial Bus (USB) memory device, memory cards with various interfaces, a Solid State Drive (SSD), and the like.

The semiconductor memory device is generally classified into a volatile memory device and a nonvolatile memory device.

The nonvolatile memory device has relatively slow write and read speeds, but retains stored data even when the supply of power is interrupted. Thus, the nonvolatile memory device is used to store data to be retained regardless of whether power is supplied. Examples of the nonvolatile memory include a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is classified into a NOR type flash memory and a NAND type flash memory.

SUMMARY

In accordance with an aspect of the present disclosure, there is provided a semiconductor memory device including: a gate stack structure including interlayer insulating layers and conductive patterns, which are alternately stacked in a vertical direction on a substrate; a plurality of channel structures penetrating the gate stack structure, each of the plurality of channel structures with one end portion protruding past a boundary of the gate stack structure; and a source layer formed on the gate stack structure, wherein the protruding end portion of each of the plurality of channel structures extends into the source layer, and wherein the protruding end portion of each of the plurality of channel structures has a flat section.

In accordance with another aspect of the present disclosure, there is provided a method of manufacturing a semiconductor memory device, the method including: forming a memory cell array on a first substrate, wherein the memory cell array includes a gate stack structure with interlayer insulating layers and conductive patterns, which are alternately stacked in a vertical direction, a plurality of channel structures penetrating the gate stack structure, the plurality of channel structures each with an end portion extending into the first substrate, and a memory layer extending from between the plurality of channel structures and the gate stack structure to between the end portion of each of the plurality of channel structures and the first substrate; removing the first substrate to expose the memory layer; forming a first source layer on the top of the entire structure including the memory layer; performing an etching process to expose and level the memory layer, the channel structure, and the first source layer to be at the same height; and forming a second source layer on the memory layer, the channel structure, and the first source layer.

In accordance with still another aspect of the present disclosure, there is provided a method of manufacturing a semiconductor memory device, the method including: forming a memory cell array on a first substrate, wherein the memory cell array includes a gate stack structure with interlayer insulating layers and conductive patterns, which are alternately stacked in a vertical direction, a plurality of channel structures penetrating the gate stack structure, the plurality of channel structures each with an end portion extending into the first substrate, and a memory layer extending from between the plurality of channel structures and the gate stack structure to between the end portion of each of the plurality of channel structures and the first substrate; forming a bit line that is connected to the memory cell array; removing the first substrate to expose the memory layer; forming a first source layer on the top of the entire structure including the memory layer; etching the first source layer, the memory layer, and the end portion of each of the plurality of channel structures by performing a Chemical Mechanical planarization (CMP) process; and forming a second source layer on the top of the entire structure that includes the first source layer, the memory layer, and the end portion of each of the plurality of channel structures, which are planarized.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 5A to 5F, 6, 7, and 8A to 8D are sectional views illustrating a manufacturing method of the semiconductor memory device in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Hereinafter, exemplary embodiments of the present disclosure will be described in detail with reference to the accompanying drawings in order for those skilled in the art to be able to readily implement the technical spirit of the present disclosure.

Embodiments provide a semiconductor memory device capable of suppressing a pattern defect in a process for connecting a channel layer with a vertical channel structure and a source layer to each other, and a manufacturing method of the semiconductor memory device.

Figure 1:
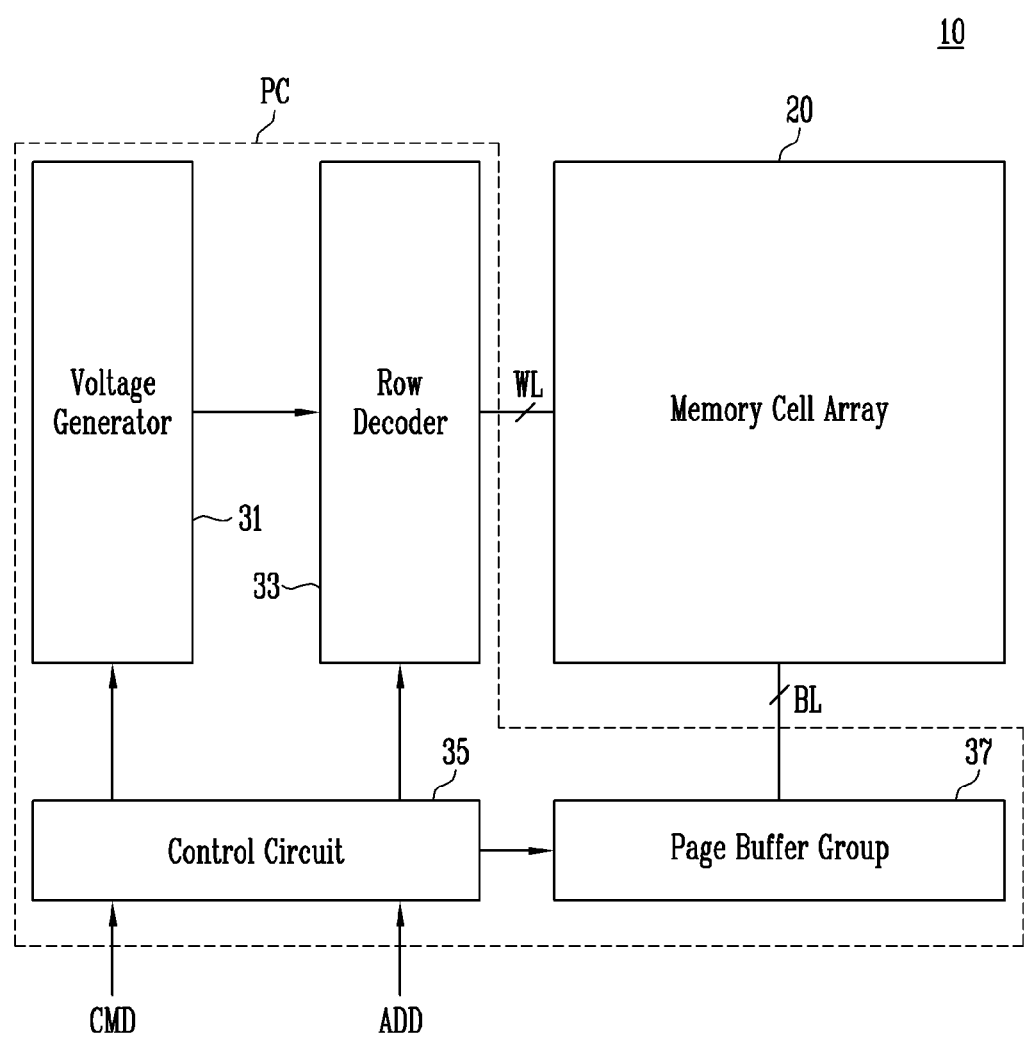
FIG. 1 is a block diagram illustrating a semiconductor memory device in accordance with an embodiment of the present disclosure.

FIG. 1 is a block diagram illustrating a semiconductor memory device in accordance with an embodiment of the present disclosure.

Referring to FIG. 1, the semiconductor memory device 10 may include a peripheral circuit PC and a memory cell array 20.

The peripheral circuit PC may be configured to control a program operation to store data in the memory cell array 20, a read operation to output data that is stored in the memory cell array 20, and an erase operation to erase data that is stored in the memory cell array 20.

In an embodiment, the peripheral circuit PC may include a voltage generator 31, a row decoder 33, a control logic 35, and a page buffer group 37.

The memory cell array 20 may include a plurality of memory blocks. The memory cell array 20 may be connected to the row decoder 33 through word lines WL and connected to the page buffer group 37 through bit lines BL.

The control logic 35 may control the voltage generator 31, the row decoder 33, and the page buffer group 37 in response to a command CMD and an address ADD.

The voltage generator 31 may generate various operating voltages, such as an erase voltage, a ground voltage, a program voltage, a verify voltage, a pass voltage, and a read voltage, which are used for a program operation, a read operation, and an erase operation, based on the control logic 35.

The row decoder 33 may select a memory block based on the control circuit 35. The row decoder 33 may apply operating voltages to word lines WL that are connected to the selected memory block.

The page buffer group 37 may be connected to the memory cell array 20 through the bit lines BL. The page buffer group 37 may temporarily store data that is received from an input/output circuit (not shown) in a program operation based on the control logic 35. The page buffer group 37 may sense a voltage or current of the bit lines BL in a read operation or a verify operation based on the control logic 35. The page buffer group 37 may select bit lines BL based on the control circuit 35.

Structurally, the memory cell array 20 may overlap with a portion of the peripheral circuit PC.

Figure 2:
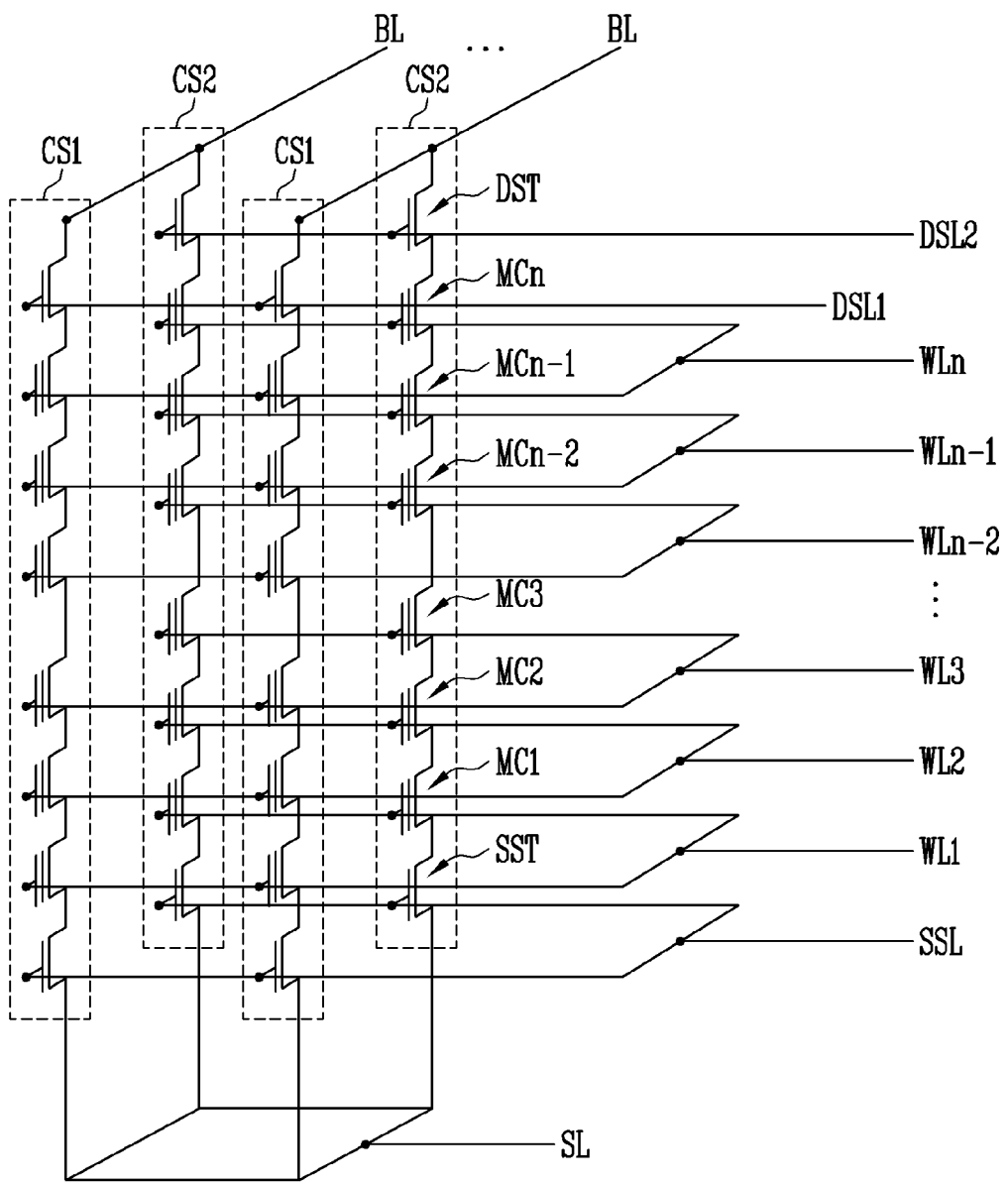
FIG. 2 is a circuit diagram illustrating a memory cell array shown in FIG. 1.

FIG. 2 is a circuit diagram illustrating the memory cell array shown in FIG. 1.

Referring to FIG. 2, the memory cell array 20 may include a plurality of cell strings CS1 and CS2 that are connected between a source line SL and a plurality of bit lines BL. The plurality of cell strings CS1 and CS2 may be commonly connected to a plurality of word lines WL1 to WLn.

Each of the plurality of cell strings CS1 and CS2 may include at least one source select transistor SST that is connected to the source line SL, at least one drain select transistor DST that is connected to the bit line BL, and a plurality of memory cells MC1 to MCn that are connected in series between the source select transistor SST and the drain select transistor DST.

Gates of the plurality of memory cells MC1 to MCn may be respectively connected to the plurality of word lines WL1 to WLn that are stacked to be spaced apart from each other. Two or more drain select lines DSL1 and DSL2 may be spaced apart from each other at the same level.

A gate of the source select transistor SST may be connected to a source select line SSL. A gate of the drain select transistor DST may be connected to a drain select line that corresponds to the gate of the drain select transistor DST.

The source line SL may be connected to a source of the source select transistor SST. A drain of the drain select transistor DST may be connected to a bit line that corresponds to the drain of the drain select transistor DST.

The plurality of cell strings CS1 and CS2 may be divided into string groups that are respectively connected to the two or more drain select lines DSL1 and DSL2. Cell strings that are connected to the same word line and the same bit line may be independently controlled by different drain select lines. Also, cell strings that are connected to the same drain select line may be independently controlled by different bit lines.

In an embodiment, the two or more drain select lines DSL1 and DSL2 may include a first drain select line DSL1 and a second drain select line DSL2. The plurality of cell strings CS1 and CS2 may include a first cell string CS1 of a first cell string group that is connected to the first drain select line DSL1 and a second cell string CS2 of a second cell string group that is connected to the second drain select line DSL2.

Figure 3:
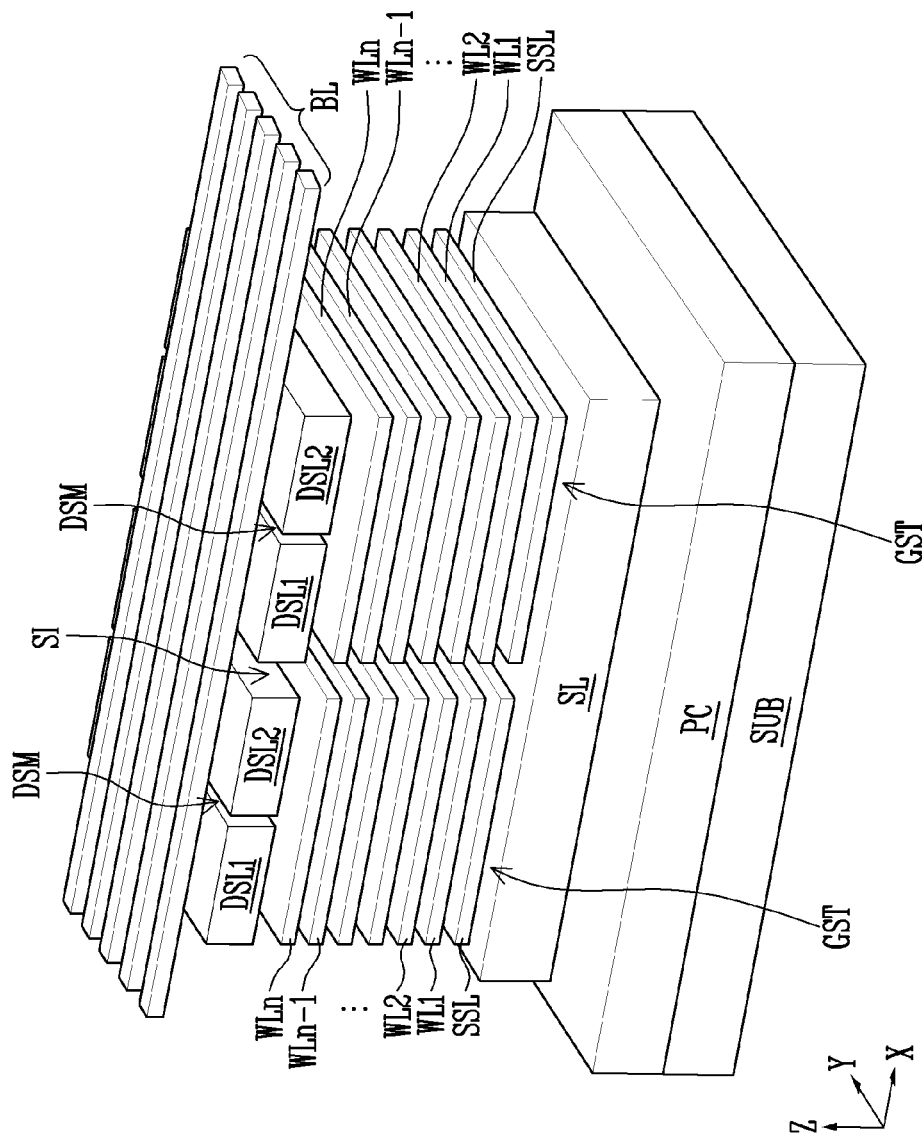
FIG. 3 is a perspective view schematically illustrating a semiconductor memory device in accordance with an embodiment of the present disclosure.

FIG. 3 is a perspective view schematically illustrating a semiconductor memory device in accordance with an embodiment of the present disclosure.

Referring to FIG. 3, the semiconductor memory device 10 may include a peripheral circuit that is disposed on a substrate SBU and gate stack structures GST that overlap with the peripheral circuit PC.

Each of the gate stack structures GST may include a source select line SSL, a plurality of word lines WL1 to WLn, and two or more drain select lines DSL1 and DSL2 that are isolated from each other at the same level by an isolation structure DSM.

The source select line SSL and the plurality of word lines WL1 to WLn may extend in a first direction X and a second direction Y and may be formed into a flat plate shape that is parallel to a top surface of the substrate SUB. The first direction X may be a direction in which an X-axis faces in an XYZ coordinate system, and the second direction Y may be a direction in which a Y-axis faces in the XYZ coordinate system.

The plurality of word lines WL1 to WLn may be stacked to be spaced apart from each other in a third direction Z. The third direction Z may be a direction in which a Z-axis faces in the XYZ coordinate system. The plurality of word lines WL1 to WLn may be disposed between the two or more drain select lines DSL1 and DSL2 and the source select line SSL.

The gate stack structures GST may be isolated from each other by a slit SI. The isolation structure DSM may be formed to be shorter in the third direction Z than the slit SI and may overlap with the plurality of word lines WL1 to WLn.

Each of the isolation structure DSM and the slit SI may extend in a linear shape, extend in a zigzag shape, or extend in a wave form. The width of each of the isolation structure DSM and the slit SI may be variously changed according to a design rule.

In accordance with an embodiment, the source select line SSL may be disposed to be closer to the peripheral circuit PC than the two or more drain select lines DSL1 and DSL2.

The semiconductor memory device 10 may include a source line SL, disposed between the gate stack structures GST and the peripheral circuit PC, and a plurality of bit lines BL, spaced apart farther from the peripheral circuit PC than the source line SL. The gate stack structures GST may be disposed between the plurality of bit lines BL and the source line SL.

Figure 4:
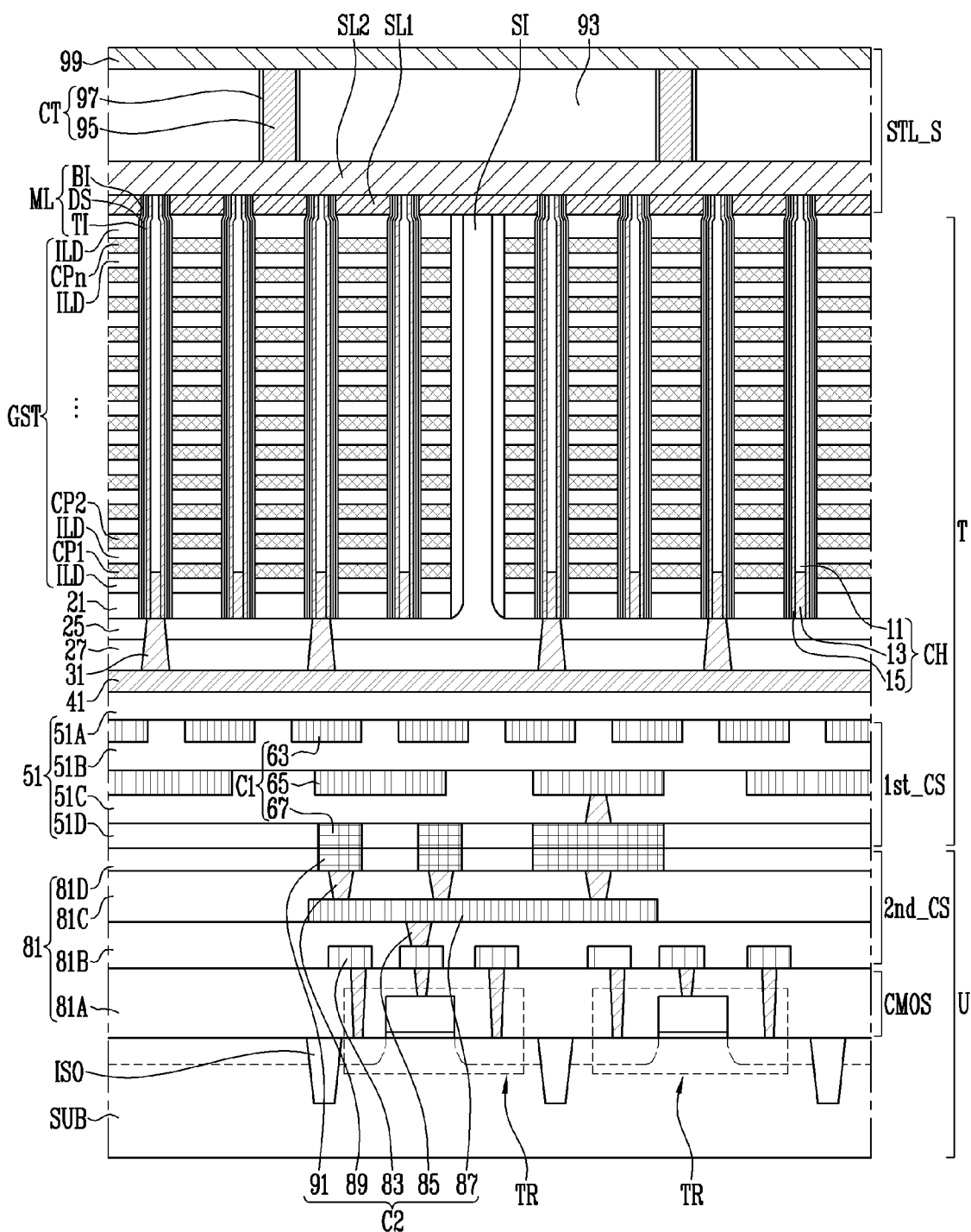
FIG. 4 is a sectional view illustrating the memory cell array shown in FIG. 1.

FIG. 4 is a sectional view illustrating the memory cell array shown in FIG. 1.

Referring to FIG. 4, in the memory cell array, a lower structure U and an upper structure T may be adhered to each other, and a string line structure STL_S may be disposed on the top of the upper structure T.

The upper structure T may include gate stack structures GST that are isolated by a slit SI, channel structures CH that penetrate the gate stack structures GST, a memory layer ML that extends along a sidewall of each of the channel structures CH, and a bit line 41 and a first connection structure C1 that are disposed under the gate stack structure GST.

The gate stack structure GST may include interlayer insulating layers ILD and conductive patterns CP1 to CPn, which are alternately stacked in a vertical direction. Each of the conductive patterns CP1 to CPn may include various conductive materials, including a doped silicon layer, a metal layer, a metal silicide layer, and a barrier layer, and the like. Each of the conductive patterns CP1 to CPn may include two or more kinds of conductive materials. For example, each of the conductive patterns CP1 to CPn may include tungsten and a titanium nitride layer (TiN) surrounding a surface of the tungsten. The tungsten is a low-resistance metal and may decrease resistance of the conductive patterns CP1 to CPn. The titanium nitride layer TiN is a barrier layer and may prevent direct contact between the tungsten and the interlayer insulating layers ILD.

A first conductive pattern CP1, among the conductive patterns CP1 to CPn, adjacent to the bit line 41, may be used as a drain select line DSL. In another embodiment, two or more conductive patterns that are adjacent to the bit line 41 and consecutively stacked may be used as drain select lines. An nth conductive pattern CPn, among the conductive patterns CP1 to CPn, adjacent to first and second source layers SL1 and SL2, may be used as a source select line SSL. In another embodiment, two or more conductive patterns that are adjacent to the first and second source layers SL1 and SL2 and consecutively stacked may be used as source select lines. Conductive patterns (e.g., CP2 to CPn−1) that are adjacent to each other in the vertical direction and disposed between the drain select line and the source select line may be used as the word lines WL1 to WLn, described above with reference to FIG. 2.

The channel structure CH may penetrate the gate stack structure GST in the vertical direction, and one end portion of the channel structure CH may be formed to protrude farther than the gate stack structure GST. The channel structure CH may be formed to be a hollow type. The channel structure CH may include a core insulating layer 11 that is filled in a central region thereof, a doped semiconductor layer 13 that is located at a lower end of the core insulating layer 11, and a channel layer 15 that surrounds the surfaces of the core insulating layer 11 and the doped semiconductor layer 13. The channel layer 15 may be used as a channel region of a cell string corresponding thereto. The channel layer 15 may be formed of a semiconductor material. In an embodiment, the channel layer 15 may include a silicon layer. The channel structure CH may be formed to protrude farther than the interlayer insulating layer ILD that is disposed at an uppermost portion of the gate stack structure GST. The protruding end portion, i.e., the core insulating layer 11 and the channel layer 15 of the channel structure CH may be formed to penetrate the first source layer SL1 and be directly connected to the second source layer SL2. The core insulating layer 11 and the channel layer 15, which protrude farther than the gate stack structure GST, may extend to the same height.

The memory layer ML may be formed to surround a surface of the channel structure CH. The memory layer ML may include a tunnel insulating layer TI that surrounds the channel layer of the channel structure CH, a data storage layer DS that surrounds the tunnel insulating layer TI, and a blocking insulating layer BI that surrounds the data storage layer DS. The memory layer ML may be formed to have the same length as the channel structure CH in the vertical direction. The memory layer ML may be formed to protrude farther than the interlayer insulating layer ILD that is disposed at the uppermost portion of the gate stack structure GST. A protruding end portion of the memory layer ML may be formed to penetrate the first source layer SL1 and be directly connected to the second source layer SL2. The core insulating layer 11, the channel layer 15, and the memory layer ML, which protrude farther than the gate stack structure GST, may extend to the same height. The memory layer ML may be defined as a component that is included in the channel structure CH. In other words, the core insulating layer 11, the channel layer 15, and the memory layer ML, which protrude farther than the gate stack structure GST, may have a flat end portion at the top of the channel structure CH.

The bit line 41 may be disposed under the gate stack structure GST. The bit line 41 may be connected to the channel structure CH through contact plugs 31 that penetrate a plurality of insulating layers 21, 25, and 27. The bit line 41 may be spaced apart from a substrate SUB by a first insulating structure 51 and a second insulating structure 81.

A first connection structure 1st_CS may include the first insulating structure 51 and first connection structures C1 that are formed in the first insulating structure 51. The first connection structures C1 may include various conductive patterns 63, 65, and 67. The first insulating structure 51 may include two or more insulating layers 51A to 51D that are stacked between the bit line 41 and the second insulating structure 81.

The lower structure U may include a CMOS circuit structure CMOS with a plurality of transistors TR and element isolation layers ISO that is formed on the substrate SUB and may include a second connection structure 2nd CS that is formed on the CMOS circuit structure CMOS. The element isolation layers ISO may include an insulating material buried in the substrate SUB.

The second connection structure 2nd CS may include the second insulating structure 81 that is formed on the substrate SUB and second connection structures C2 that are formed in the second insulating structure 81. Each of the second connection structures C2 may include various conductive patterns 83, 85, 87, 89, and 91 that are buried in the second insulating structure 81. The second insulating structure 81 may include two or more insulating layers 81A to 81D that are sequentially stacked.

The upper structure T and the lower structure U may have a structure in which the upper structure T adheres to the lower structure U through a bonding process. For example, exposed conductive patterns 67 of the first connection structure 1st_CS of the upper structure T and exposed conductive patterns 91 of the second connection structure 2nd_CS of the lower structure U may be disposed while facing each other and adhered to each other. The conductive patterns 67 and the conductive patterns 91 may be defined as a bonding metal.

The string line structure STL_S may be disposed on the upper structure T. The string line structure STL_S may be disposed on the top of the gate stack structure GST. The string line structure STL_S may include the first and second source layers SL1 and SL2 that are in contact with the channel structure CH that protrudes farther than the gate stack structure GST, an insulating layer 93 and an upper line 99, which are disposed on the top of the second source layer 51_2, and at least one contact plug CT that penetrates the insulating layer 93 to connect the second source layer SL2 to the upper line 99.

The contact plug CT may include a contact conductive layer 95 and a diffusion barrier 97 that surround a sidewall of the contact conductive layer 95. Each of the contact plugs CT electrically connects one conductive layer 93 and one upper line 99 to each other.

The first and second source layers SL1 and 51_2, the contact plug CT, and the upper line 99 may be used as the source line SL shown in FIG. 2.

FIGS. 5A to 5F, 6, 7, and 8A to 8D are sectional views illustrating a manufacturing method of the semiconductor memory device in accordance with an embodiment of the present disclosure.

FIGS. 5A to 5F are sectional views illustrating a process of forming, on a first substrate, a memory cell array, a first line array, and first connection structures.

Figure 5A:
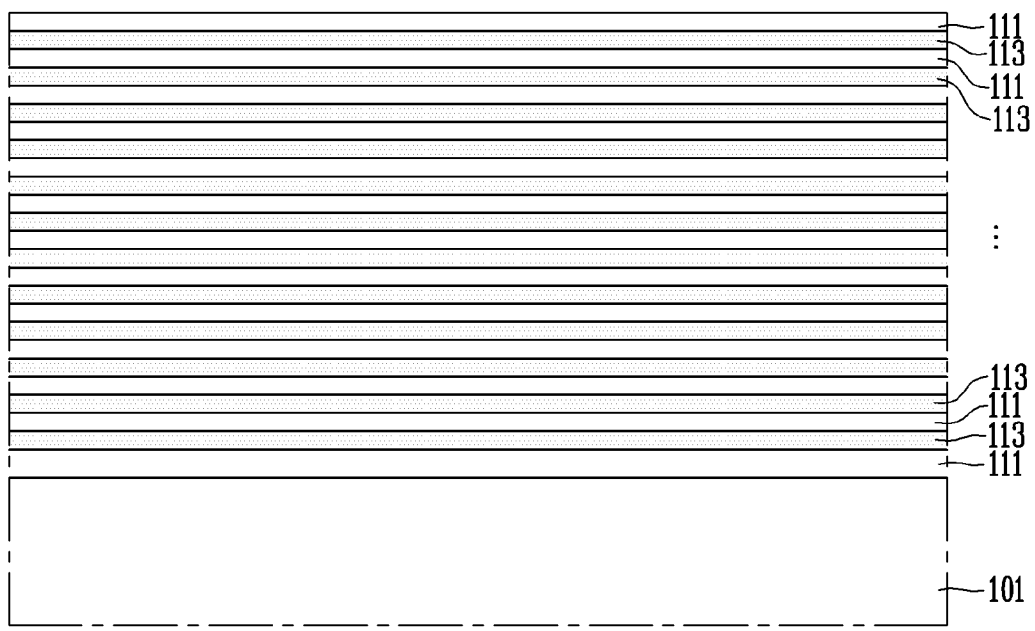

Referring to FIG. 5A, first material layers 111 and second material layers 113 may be alternately stacked one by one on a first substrate 101.

The first substrate 101 may be formed of a material with an etching rate different from those of the first material layers 111 and the second material layers 113. For example, the substrate 101 may include silicon.

In an embodiment, the first material layers 111 may be formed of an insulating material for the interlayer insulating layers ILD described above with reference to FIG. 4. The second material layers 113 may be formed of a material with an etching rate different from that of the first material layers 111. For example, the first material layers 111 may include silicon oxide, and the second material layers 113 may include silicon nitride. In the following drawings, an embodiment in which the first material layers 111 are formed of an insulating material and the second material layers 113 are formed as sacrificial layers is illustrated, but the present disclosure is not limited thereto. Properties of the first material layers 111 and the second material layers 113 may be variously changed. For example, the first material layers 111 may be formed of an insulating material for the interlayer insulating layers ILD, described above with reference to FIG. 4, and the second material layers 113 may be formed of a conductive material for the conductive patterns CP1 to CPn, described above with reference to FIG. 4.

Figure 5B:
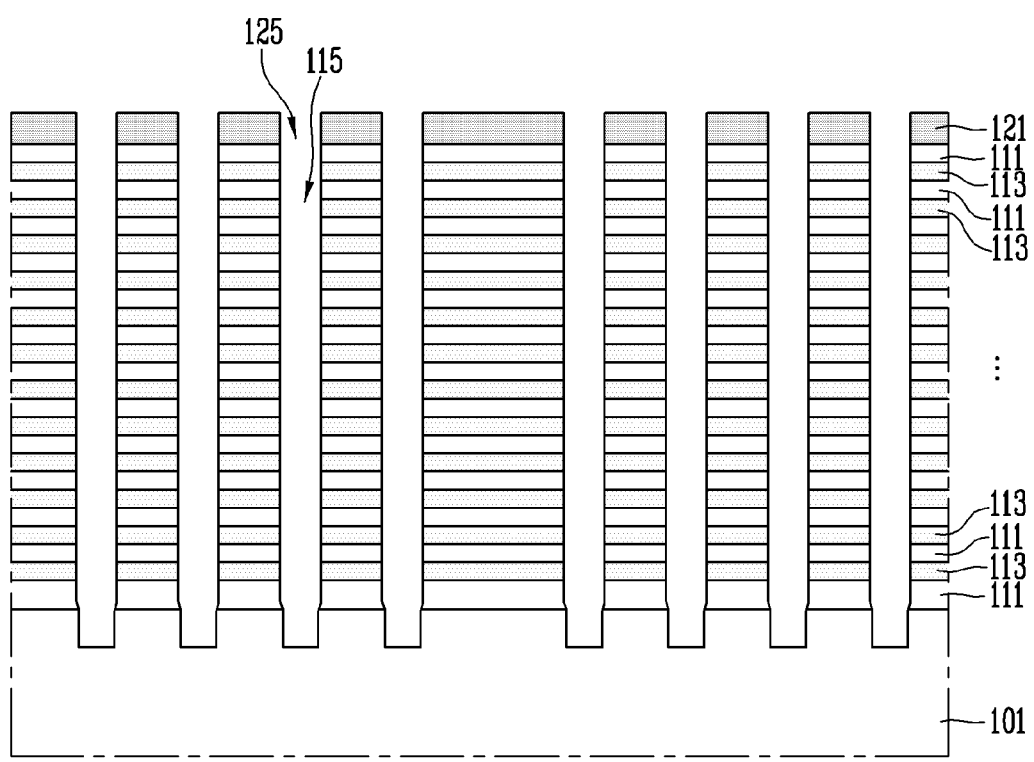

Referring to FIG. 5B, a first mask pattern 121 with first openings 125 may be formed on the stack structure of the first material layers 111 and the second material layers 113. Subsequently, channel holes 115 that penetrate the first material layers 111 and the second material layers 113 may be formed through the first openings 125 of the first mask pattern 121. The channel holes 115 may extend into the substrate 101 to a partial depth of the substrate 101. The channel holes 115 may be formed of various shapes according to an etching material that is used to form the channel holes 115.

In an embodiment, the channel holes 115 may be formed by using a first etching material. Etching speeds of the first material layers 111 and the second material layers 113 with respect to the first etching material may be faster than that of the first substrate 101 with respect to the first etching material. As a result, a width of the end portions of the channel holes 115, which extend into the first substrate 101, may be formed to be narrower than that of the channel holes 115 that penetrate the first material layers 111 and the second material layers 113.

Figure 5C:
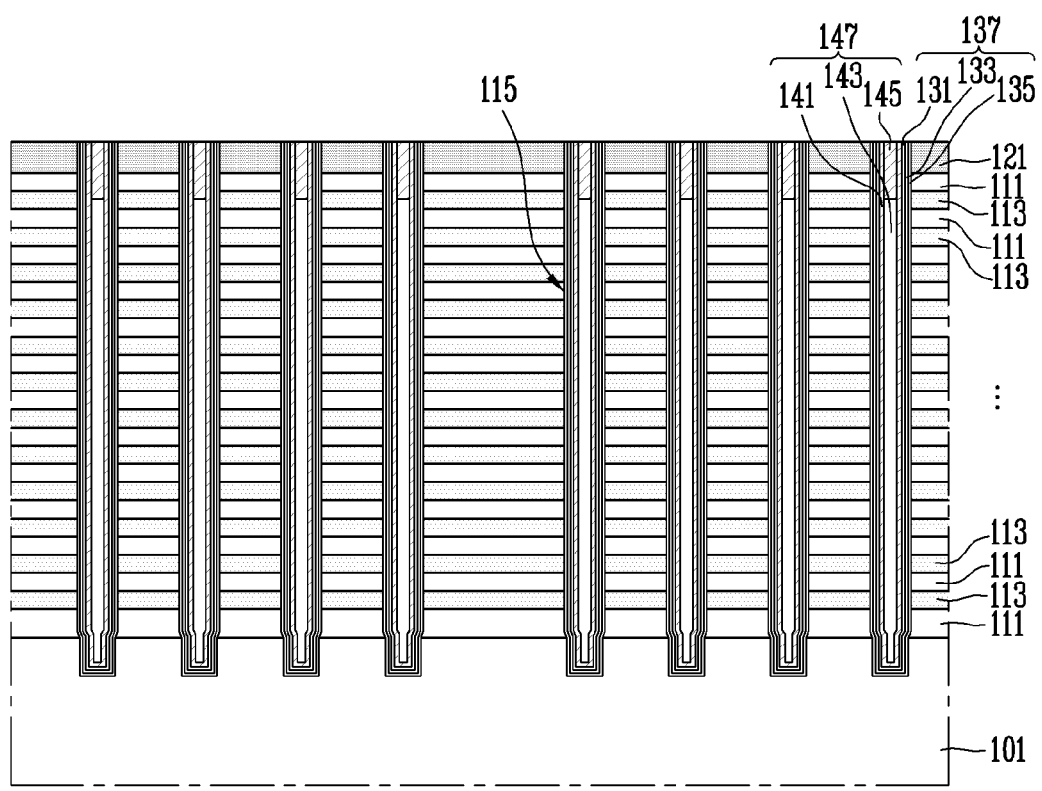

Referring to FIG. 5C, a memory layer 137 and a channel structure 147 may be formed in the channel hole 115. A sidewall of the channel structure 147 and an end portion of the channel structure 147, which extends into the first substrate 101, may be surrounded by the memory layer 137.

The process of forming the memory layer 137 may include a process of sequentially stacking a blocking insulating layer 135, a data storage layer 133, and a tunnel insulating layer 131 on a surface of each of the channel holes 115. The blocking insulating layer 135, the data storage layer 133, and the tunnel insulating layer 131 may include the same materials as the blocking insulating layer BI, the data storage layer DS, and the tunnel insulating layer TI, which are described above with reference to FIG. 4. The memory layer 137 may be formed in a liner shape, and a central region of each of the channel holes 115 may be defined by the memory layer 137.

Subsequently, the channel structure 147 may be formed by forming a channel layer 141 on a surface of the memory layer 137. The channel layer 141 may include a semiconductor layer that is used as a channel region. For example, the channel layer 141 may include silicon.

In an embodiment, the channel layer 141 may be formed in a liner shape, and the central region of each of the channel holes 115 may include a portion that is not filled with the channel layer 141. When the channel layer 141 is formed in the liner shape, the process of forming the channel structure 147 may include a process of filling a core insulating layer 143 in the central region of each of the channel holes on the channel layer 141, a process of defining a recess region at a portion of the central region of each of the channel holes 115 by etching a portion of the core insulating layer 143, and a process of filling the recess region with a doped semiconductor layer 145. The core insulating layer 143 may include oxide, and the doped semiconductor layer 145 may include a conductivity type dopant. The conductivity type dopant may include an n-type dopant for junctions. The conductivity type dopant may include a counter-doped p-type dopant.

In another embodiment, the channel layer 141 may be formed to fill the central region of each of the channel holes 115, and the core insulating layer 143 and the doped semiconductor layer 145 may be omitted. When the core insulating layer 143 and the doped semiconductor layer 145 are omitted, the process of forming the channel structure 147 may further include a process of doping the conductivity type dopant into the channel layer 141.

Figure 5D:
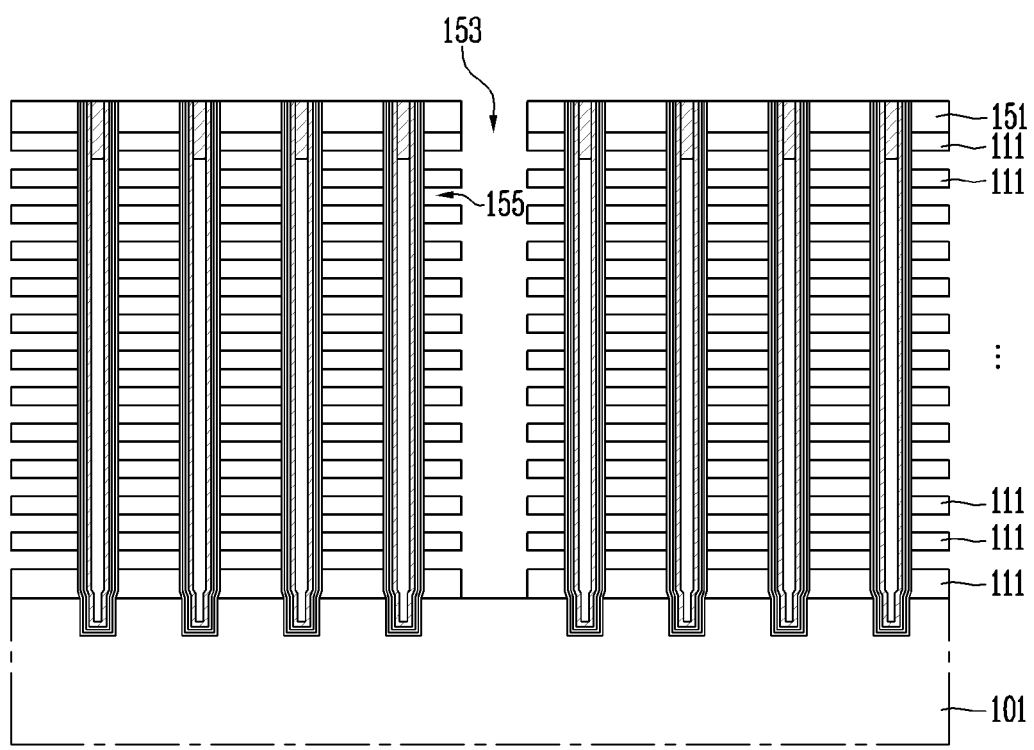

Referring to FIG. 5D, a first insulating layer 151 may be formed after the first mask pattern 121 shown in FIG. 5C is removed.

Subsequently, a slit 153 may be formed. The slit 153 may penetrate the first insulating layer 151 and penetrate the stack structure of the first material layers 111 and the second material layers 113. The slit 153 may correspond to the slit SI, shown in FIG. 4. Subsequently, horizontal spaces 155 may be defined by selectively removing the second material layers 113 that are exposed through the slit 153. The horizontal spaces 155 may be defined between the first material layers 111 that are adjacent to each other in a vertical direction.

Figure 5E:
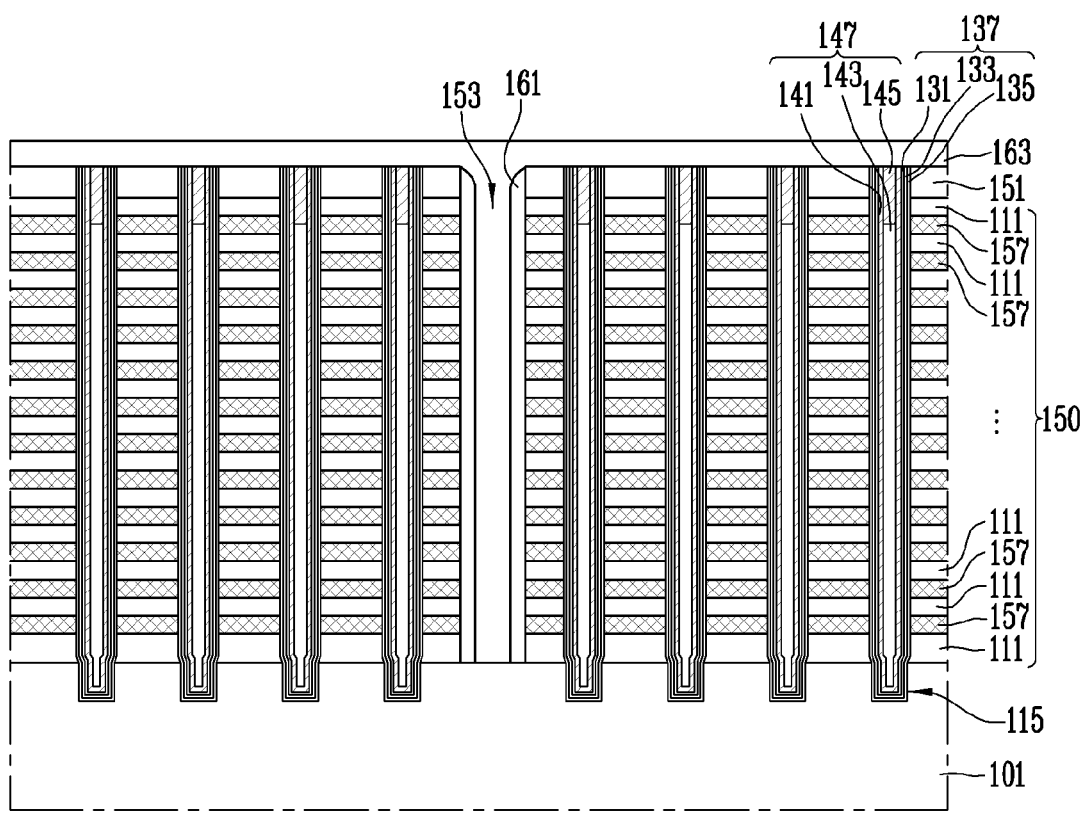

Referring to FIG. 5E, the horizontal spaces 155, shown in FIG. 5D, are respectively filled with third material layers 157 through the slit 153. The third material layers 157 may be conductive patterns CP1 to CPn, described above with reference to FIG. 4. The third material layers 157 may fill the horizontal spaces 155 to surround the channel structure 147 and the memory layer 137.

As described above, a gate stack structure 150 may be formed on the first substrate 101 by replacing the second material layers 113 as sacrificial layers with the third material layers 157 as conductive patterns. The gate stack structure 150 may include a structure in which the first material layers 111 as interlayer insulating layers and the third material layers 157 as conductive patterns are alternately stacked. The gate stack structure 150 may be penetrated by the channel structure 147, and the channel structure 147 may extend into the first substrate 101. The memory layer 137 may surround the channel structure 147, providing a barrier between the channel structure 147 and the gate structure 150 and between the channel structure 147 and the first substrate 101.

Through the processes described above with reference to FIGS. 5A to 5E, a memory block with the plurality of cell strings CS1 and CS2, described above with reference to FIG. 3, may be formed on the first substrate 101. Each of the cell strings may include a drain select transistor DST and memory cells MC1 to MCn, which are connected in series. The drain select transistor DST and memory cells MC1 to MCn, which are described above with reference to FIG. 3, may define intersection portions of the channel structure 147 and the third material layers 137 as conductive patterns, which are shown in FIG. 5E, and may be connected in series by the channel structure 147.

Subsequently, a sidewall insulating layer 161 may be formed, covering a sidewall of the gate stack structure 150.

Subsequently, a second insulating layer 163 may be formed, filling the slit 153 and extending to cover the sidewall insulating layer 161 and the first insulating layer 151.

Figure 5F:
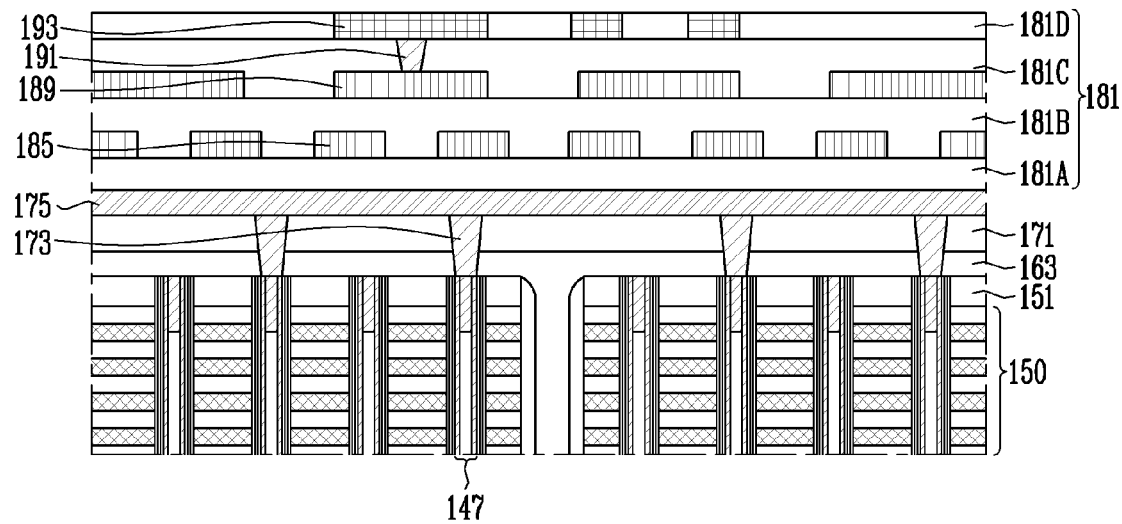

Referring to FIG. 5F, a third insulating layer 171 may be formed on the second insulating layer 163. Subsequently, contact plugs 173 may be formed, penetrating the third insulating layer 171 or penetrating the third insulating layer 171 and the second insulating layer 163. The contact plugs 173 may extend to be in contact with the channel structure 147.

Subsequently, a first line array 175 may be formed. The first line array 175 may be a bit line that is connected to the contact plug 173. Subsequently, a first insulating structure 181 may be formed, which cover the first line array 175. The first insulating structure 181 may include two or more insulating layers 181A to 181D. First connection structures 185, 189, 191, and 193 may be buried in the first insulating structure 181. The first connection structures 185, 189, 191, and 193 may be electrically connected to each other through contact plugs (not shown).

The first connection structures 185, 189, 191, and 193 may include a first bonding metal 193 with a surface that is exposed to the outside of the first insulating structure 181.

Figure 6:
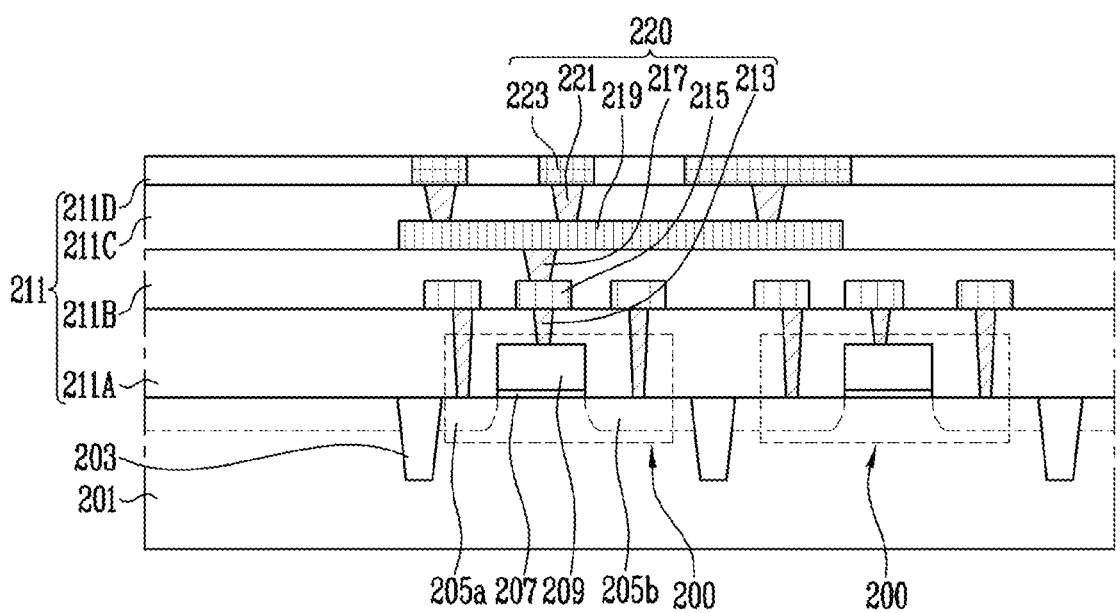

FIG. 6 is a sectional view illustrating a process of forming a CMOS circuit and second connection structures on a second substrate.

Referring to FIG. 6, a process may be included, in which a plurality of transistors 200 constituting a complementary metal oxide semiconductor (CMOS) circuit are formed.

The second substrate 201 may be a bulk silicon substrate, a silicon on insulator substrate, a germanium substrate, a germanium on insulator substrate, a silicon-germanium substrate, or an epitaxial thin film formed through a selective epitaxial growth process.

Each of the transistors 200 may be formed in an active region of the second substrate 201, which is partitioned by an isolation layer 203. Each of the transistors 200 may include a gate insulating layer 207 and a gate electrode 209, which are stacked on an active region corresponding thereto, and junctions 205a and 205b that are formed in the active region at both sides of the gate electrode 209. The junctions 205a and 205b may include a conductivity type dopant for implementing a transistor that corresponds thereto. The junctions 205a and 205b may include at least one of an n-type dopant and a p-type dopant.

After the plurality of transistors 200 are formed, second connection structures 220 and a second insulating structure 211 may be formed. The second connection structures 220 may be connected to the transistors 200 constituting the CMOS circuit, and the second insulating structure 211 may cover the second connection structures 220 and the transistors 200.

The second insulating structure 211 may include two or more insulating layers 211A to 211D. The second connection structures 220 may be buried in the second insulating structure 211. Each of the second connection structure 220 may include a plurality of conductive patterns 213, 215, 217, 219, 221, and 223. The second insulating structure 211 and the second connection structures 220 are not limited to the example shown in the drawing and may be variously changed.

The conductive patterns 213, 215, 217, 219, 221, and 223 that are included in each of the second connection structures 220 may include a second bonding metal 223 with a surface that is exposed to the outside.

Figure 7:
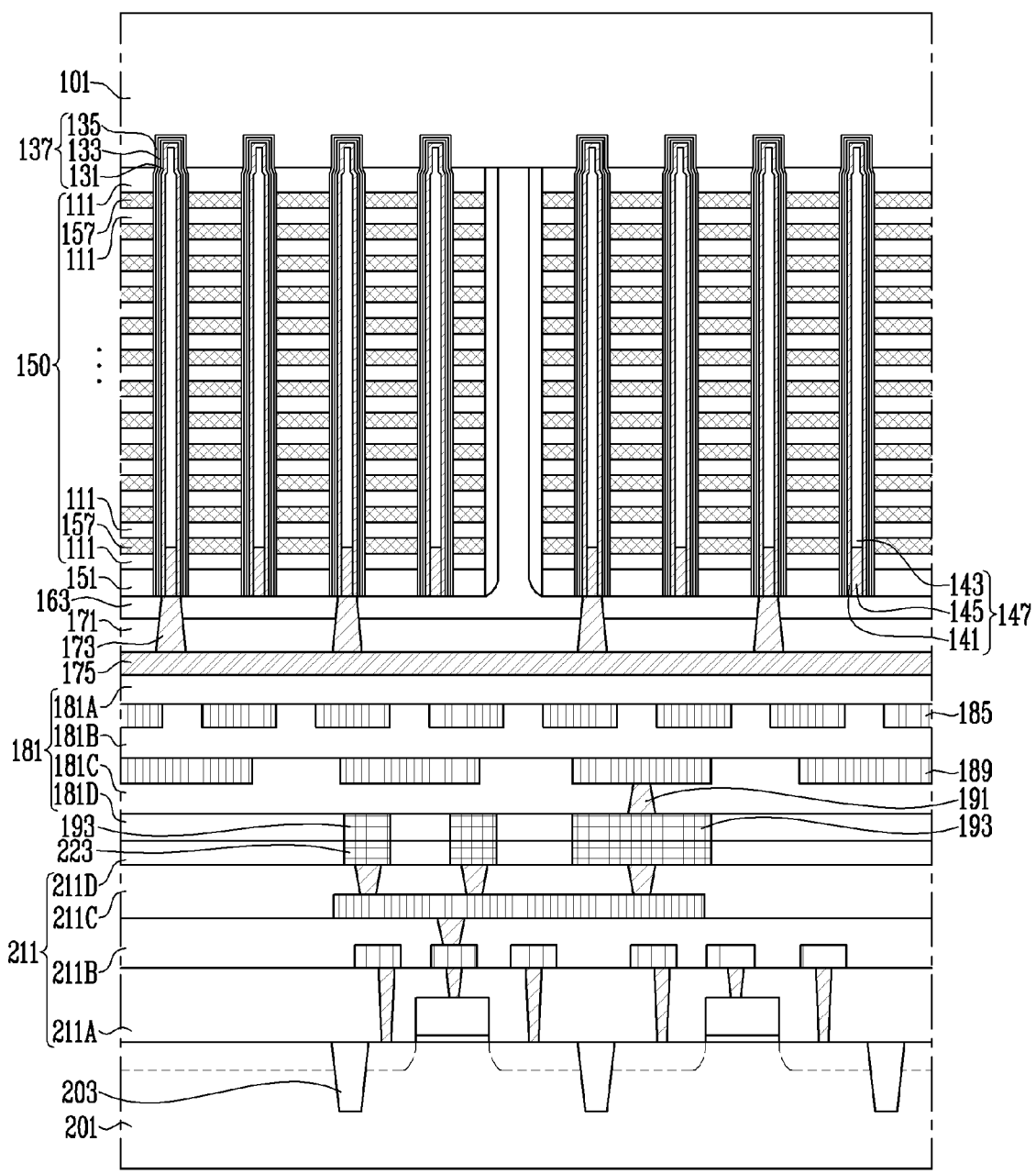

FIG. 7 is a sectional view illustrating a process of allowing the first connection structures and the second connection structures to be adhered to each other.

Referring to FIG. 7, the first substrate 101 and the second substrate 201 may be aligned such that the first bonding metal 193 on the first substrate 101 and the second bonding metal 223 on the second substrate 201 may be in contact with each other. The first bonding metal 193 and the second bonding metal 223 may include various metals, and include, for example, copper.

Subsequently, the first bonding metal 193 and the second bonding metal 223 may be adhered to each other. To this end, after heat is applied to the first bonding metal 193 and the second bonding metal 223, the first bonding metal 193 and the second bonding metal 223 may be cured. However, the present disclosure is not limited thereto, and various processes for connecting the first bonding metal 193 and the second bonding metal 223 to each other may be introduced.

FIGS. 8A to 8D are sectional views illustrating a process of forming a string line that is connected to a plurality of cell strings on the gate stack structure 150.

Referring to FIG. 8A, the first substrate 101 shown in FIG. 7 may be removed. When the first substrate 101 is removed, the memory layer 137 may serve as an etch stop layer. Accordingly, the channel layer 141 that protrudes farther than the gate stack structure 150 can be protected by the memory layer 137.

Subsequently, boron may be implanted into the channel layer 14 that is used as a channel of a source select transistor by performing an ion implantation process. Accordingly, a threshold voltage of the source select transistor can be adjusted.

Figure 8B:
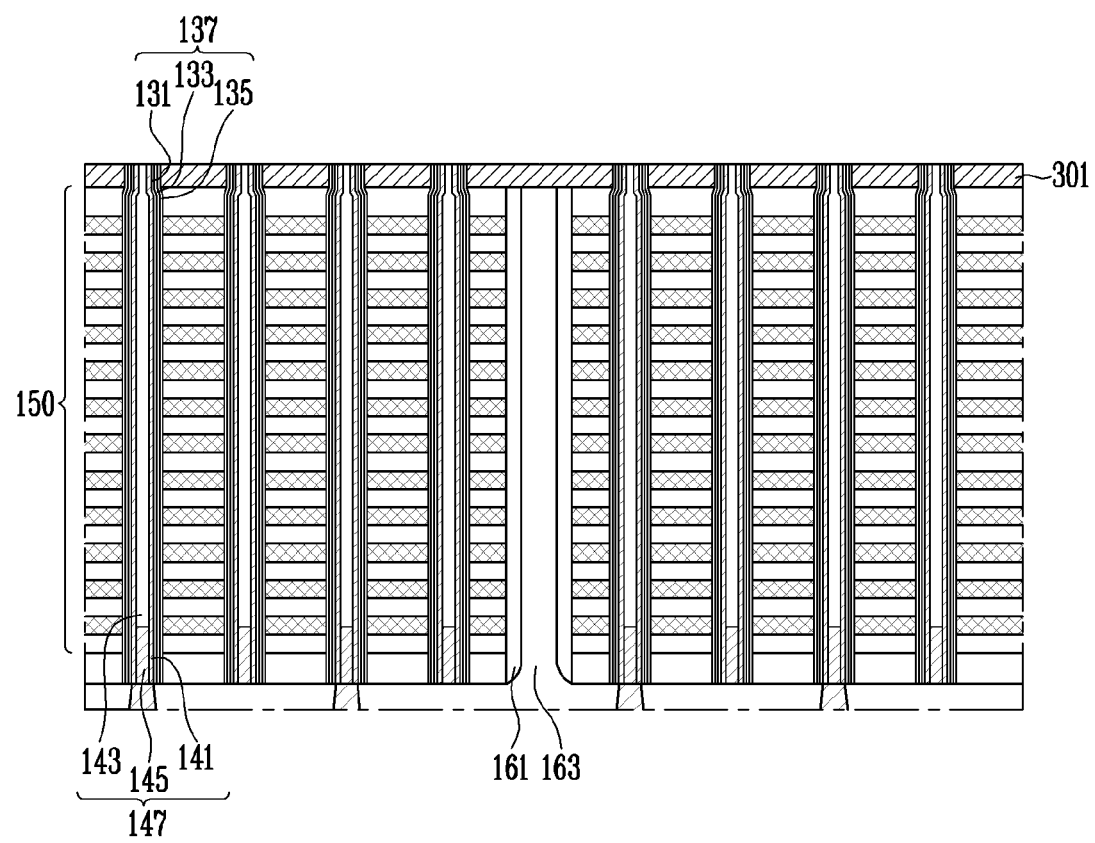

Referring to FIG. 8B, a first source layer 301 may be formed on the gate stack structure 150 to cover the memory layer 137 protruding farther than the gate stack structure 150. The first source layer 301 may be formed as a poly-silicon layer doped with an N-type impurity.

Subsequently, an etching process may be performed to expose the core insulating layer 143. The etching process may be preferably performed by using a Chemical Mechanical Planarization (CMP) process. In the etching process that exposes the core insulating layer 143, the end portion of the memory layer 137 may be etched to have a uniform height. As a result that is obtained by performing the etching process using the CMP process, upper surfaces of the first source layer 301, the memory layer 137, the channel layer 141, and the core insulating layer 143 may have a uniform height.

Figure 8C:
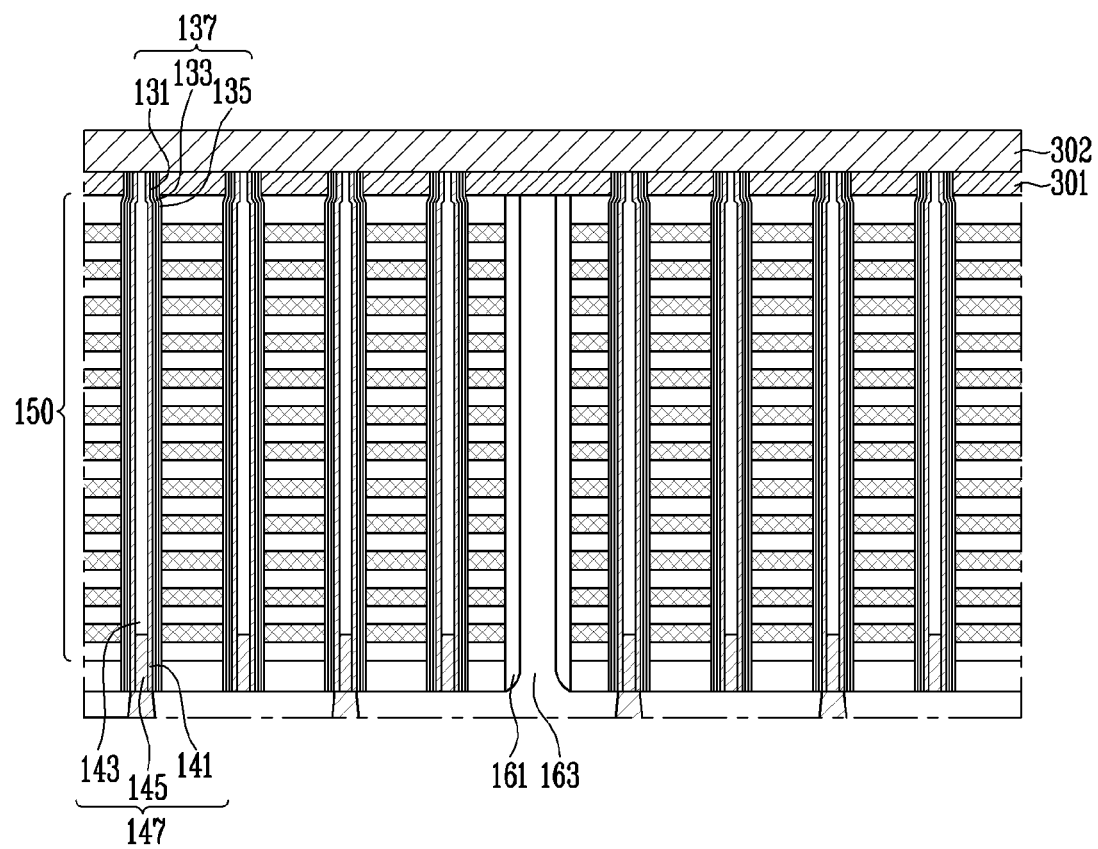

Referring to FIG. 8C, a second source layer 302 may be formed on the top of the first source layer 301, the memory layer 137, and the channel layer 141, and the core insulating layer 143. The second source layer 302 may be formed as a poly-silicon layer that is doped with an N-type impurity. The second source layer 302 may be connected to the channel layer 141 while being in direct contact with the channel layer 141.

Subsequently, a heat treatment process is utilized such that the impurities in the first and second source layers 301 and 302 are diffused into the channel layer 141. A heat treatment process may use a laser for the heat treatment. A region in which the second source layer 302 and the channel layer 141 are in contact with each other may be locally heat-treated through the heat treatment process by using a laser.

Figure 8D:
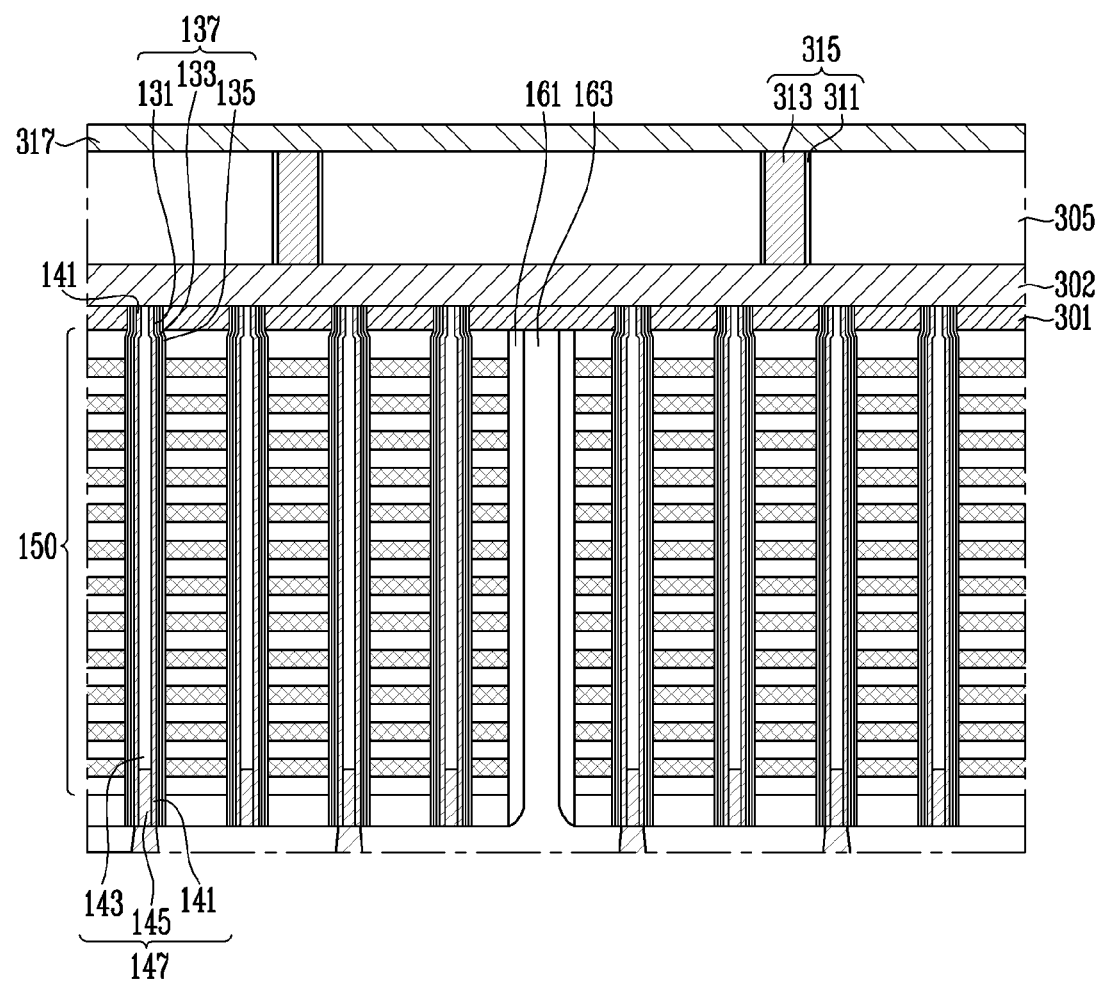

Referring to FIG. 8D, an interlayer insulating layer 305 may be formed, which covers the second source layer 302. Subsequently, at least one contact plug 315 may be formed, which penetrates the interlayer insulating layer 305. The contact plug 315 may be in contact with the second source layer 302. The contact plug 315 may include a diffusion barrier 311 that is formed on a sidewall of a contact hole and a contact conductive layer 313 that fills the contact hole.

Subsequently, an upper line 317 that is connected to the contact plug 315 is formed on the interlayer insulating layer 350. The first source layer 301, the second source layer 302, the contact plug 315, and the upper line 317 may be defined as the source line SL, shown in FIG. 2.

Figure 9:
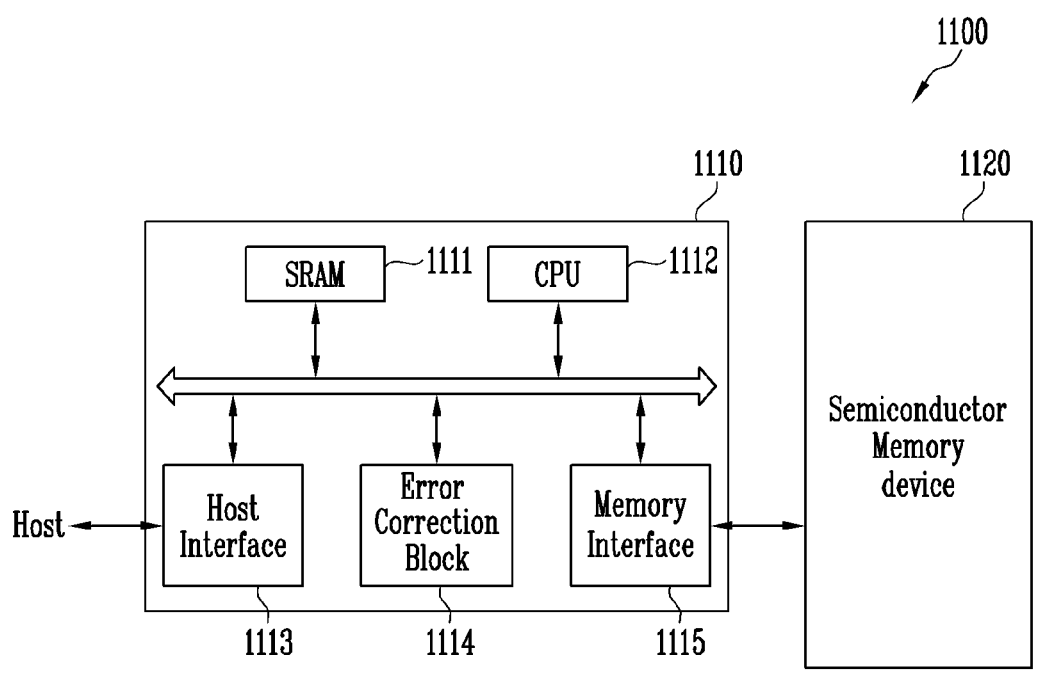
FIG. 9 is a block diagram illustrating a configuration of a memory system in accordance with an embodiment of the present disclosure.

FIG. 9 is a block diagram illustrating a configuration of a memory system 1100 in accordance with an embodiment of the present disclosure.

Referring to FIG. 9, the memory system 1100 may include a semiconductor memory device 1120 and a memory controller 1110.

The semiconductor memory device 1120 may be a multi-chip package configured with a plurality of flash memory chips. The semiconductor memory device 1120 may be the semiconductor memory device described with reference to FIGS. 1 to 4.

The memory controller 1110 may control the semiconductor memory device 1120 and may include a Static Random Access Memory (SRAM) 1111, a Central Processing Unit (CPU) 1112, a host interface 1113, an error correction block 1114, and a memory interface 1115. The SRAM 1111 may be used as an operation memory of the CPU 1112, the CPU 1112 may perform overall control operations for data exchange of the memory controller 1110, and the host interface 1113 may include a data exchange protocol for a host that is connected with the memory system 1100. The error correction block 1114 may detect and correct an error that is included in a data that is read from the semiconductor memory device 1120, and the memory interface 1115 may interface with the semiconductor memory device 1120. In addition, the memory controller 1110 may further include a Read Only Memory (ROM) that stores code data for interfacing with the host, and the like.

The memory system 1100, configured as described above, may be a memory card or a Solid State Disk (SSD), in which the semiconductor memory device 1120 is combined with the controller 1110. For example, when the memory system 1100 is an SSD, the memory controller 1100 may communicate with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

Figure 10:
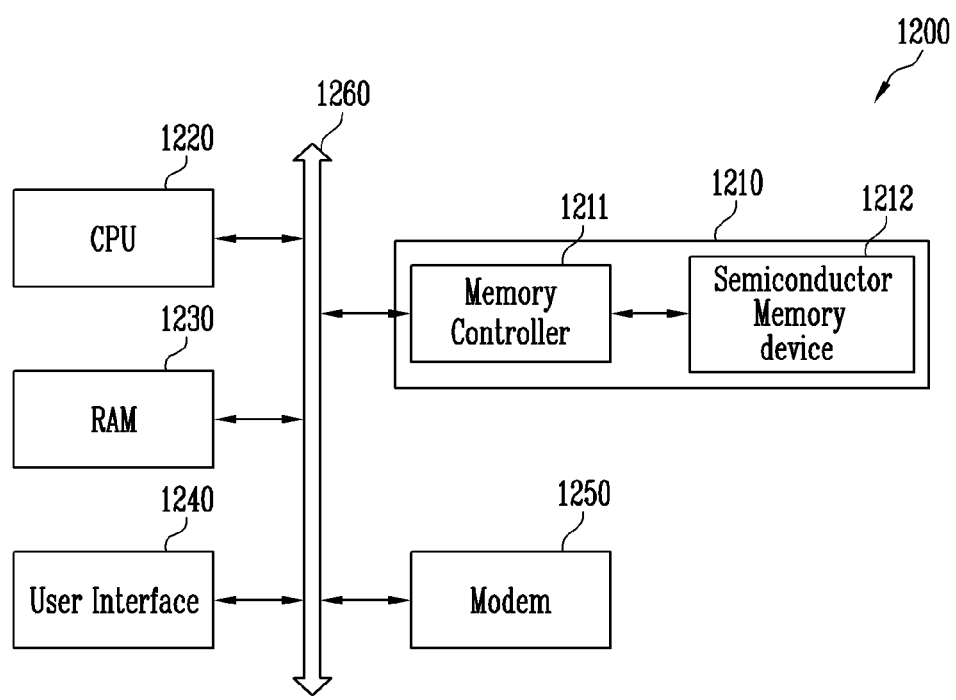
FIG. 10 is a block diagram illustrating a configuration of a computing system in accordance with an embodiment of the present disclosure.

FIG. 10 is a block diagram illustrating a configuration of a computing system in accordance with an embodiment of the present disclosure.

Referring to FIG. 10, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, an image processor, a mobile D-RAM, and the like may be further included.

In accordance with the present disclosure, a horn formation can be prevented from occurring in an etching process of a vertical channel structure for exposing a channel layer in a process for connecting a channel layer of the vertical channel structure and a source layer to each other, and accordingly, a pattern defect of the semiconductor memory device can be suppressed.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A method of manufacturing a semiconductor memory device, the method comprising:
    forming a memory cell array on a first substrate, wherein the memory cell array includes:
        a gate stack structure with interlayer insulating layers and conductive patterns, which are alternately stacked in a vertical direction,
        a plurality of channel structures penetrating the gate stack structure, the plurality of channel structures each with an end portion extending into the first substrate, and
        a memory layer extending from between the plurality of channel structures and the gate stack structure to between the end portion of each of the plurality of channel structures and the first substrate;
    removing the first substrate to expose the memory layer;
    forming a first source layer on the top of the entire structure including the memory layer;
    performing an etching process to expose and level the memory layer, the channel structure, and the first source layer to be at the same height; and
    forming a second source layer on the memory layer, the channel structure, and the first source layer.

2. The method of claim 1, wherein the etching process is performed by using a Chemical Mechanical Planarization (CMP) process.

3. The method of claim 1, further comprising implanting an impurity into the channel structure by performing an ion implantation process before the first source layer is formed.

4. The method of claim 1, further comprising performing a heat treatment process after the second source layer is formed.

5. The method of claim 4, wherein, in the heat treatment process, heat is locally applied to a region in which the second source layer and the channel layer are in contact with each other by using a laser.

6. A method of manufacturing a semiconductor memory device, the method comprising:
    forming a memory cell array on a first substrate, wherein the memory cell array includes:
        a gate stack structure with interlayer insulating layers and conductive patterns, which are alternately stacked in a vertical direction,
        a plurality of channel structures penetrating the gate stack structure, the plurality of channel structures each with an end portion extending into the first substrate, and
        a memory layer extending from between the plurality of channel structures and the gate stack structure to between the end portion of each of the plurality of channel structures and the first substrate;
    forming a bit line that is connected to the memory cell array;
    removing the first substrate to expose the memory layer;
    forming a first source layer on the top of the entire structure including the memory layer;
    etching the first source layer, the memory layer, and the end portion of each of the plurality of channel structures by performing a Chemical Mechanical planarization (CMP) process; and
    forming a second source layer on the top of the entire structure that includes the first source layer, the memory layer, and the end portion of each of the plurality of channel structures, which are planarized.

7. The method of claim 6, further comprising:
    forming an insulating layer on the second source layer;
    forming a contact that penetrates the insulating layer to be connected to the second source layer; and
    forming an upper line on the insulating layer to be connected to the contact.

8. The method of claim 6, further comprising implanting an impurity into the channel structure by performing an ion implantation process before the first source layer is formed.

9. The method of claim 6, further comprising performing a heat treatment process after the second source layer is formed.

10. The method of claim 9, wherein, in the heat treatment process, heat is locally applied to a region in which the second source layer and the channel layer are in contact with each other by using a laser.

11. The method of claim 6, further comprising, before the first substrate is removed:
    forming a conductive first connection structure on the bit line;
    forming a Complementary Metal Oxide Semiconductor (CMOS) circuit on a second substrate;
    forming a conductive second connection structure that is connected to the CMOS circuit on the second substrate; and
    allowing a first bonding metal of the first connection structure and a second bonding metal of the second connection structure to be adhered to each other such that the first connection structure and the second connection structure are connected to each other.

* * * * *